(12) United States Patent
Hueting et al.

(10) Patent No.: US 7,629,647 B2
(45) Date of Patent: Dec. 8, 2009

(54) TRENCH MOS STRUCTURE

(75) Inventors: Raymond J. E. Hueting, Helmond (NL); Erwin A. Hijzen, Blanden (BE)

(73) Assignee: NXP B.V., Eindhoven (NL)

( * ) Notice: Subject to any disclaimer, the term of this patent is extended or adjusted under 35 U.S.C. 154(b) by 180 days.

(21) Appl. No.: 10/562,254

(22) PCT Filed: Jun. 10, 2004

(86) PCT No.: PCT/IB2004/001977

§ 371 (c)(1),
(2), (4) Date: Dec. 20, 2005

(87) PCT Pub. No.: WO2004/114410

PCT Pub. Date: Dec. 29, 2004

(65) Prior Publication Data

US 2006/0202305 A1    Sep. 14, 2006

(30) Foreign Application Priority Data

Jun. 20, 2003    (GB)    ................... 0314392.2

(51) Int. Cl.
*H01L 29/423* (2006.01)
(52) U.S. Cl. .............................. 257/331; 257/E29.136; 257/E29.258
(58) Field of Classification Search ................ 257/119, 257/122, 130, 141, 162, 343, 390, E21.373, 257/E21.435, E29.029, E29.12, E45.002, 257/E29.027, E29.136, E29.197, E29.201, 257/E29.26, E29.261, 330, 331, E29.258
See application file for complete search history.

(56) References Cited

U.S. PATENT DOCUMENTS

| | | | | |
|---|---|---|---|---|
| 4,839,309 A | * | 6/1989 | Easter et al. | 438/404 |
| 5,142,640 A | | 8/1992 | Iwamatsu | |
| 5,349,224 A | * | 9/1994 | Gilbert et al. | 257/333 |
| 5,349,225 A | * | 9/1994 | Redwine et al. | 257/336 |
| 5,359,221 A | * | 10/1994 | Miyamoto et al. | 257/408 |
| 6,201,278 B1 | * | 3/2001 | Gardner et al. | 257/330 |
| 6,316,807 B1 | * | 11/2001 | Fujishima et al. | 257/333 |
| 6,452,231 B1 | * | 9/2002 | Nakagawa et al. | 257/343 |
| 6,515,348 B2 | * | 2/2003 | Hueting et al. | 257/623 |
| 6,534,823 B2 | * | 3/2003 | Hueting et al. | 257/330 |
| 6,555,872 B1 | * | 4/2003 | Dennen | 257/327 |
| 2001/0045599 A1 | | 11/2001 | Heuting et al. | |

FOREIGN PATENT DOCUMENTS

| | | |
|---|---|---|
| EP | 0 735 589 | 10/1996 |
| WO | WO 99/43029 | 8/1999 |

* cited by examiner

*Primary Examiner*—Minh-Loan T Tran
*Assistant Examiner*—W. Wendy Kuo

(57) ABSTRACT

A semiconductor device has a trench (42) adjacent to a cell (18). The cell includes source and drain contact regions (26, 28), and a central body (40) of opposite conductivity type. The device is bidirectional and controls current in either direction with a relatively low on-resistance. Preferred embodiments include potential plates (60) that act together with source and drain drift regions (30, 32) to create a RESURF effect.

16 Claims, 4 Drawing Sheets

TRENCH MOS STRUCTURE

The invention relates to trench MOS structures, particularly lateral trench MOS structures for bi-directional switching.

For many applications it is attractive to have a switch which is capable of switching both negative and positive bias. For example, in portable apparatus powered by a rechargeable battery or a single cell, a power switch is used to connect the battery to the apparatus. The power switch needs to be able to block current passing in either direction through it.

One solution is to use two low-voltage trench Metal Oxide Semiconductor Field Effect Transistors (MOSFETs) in series. The drains or sources of the two MOSFETs are connected together in common drain or common source modes respectively. When both MOSFETs are switched on the pair conduct for charging. A disadvantage of this approach is that the use of two MOSFETs increases the resistance of the pair above the resistance of a single device.

A prior solution is the so-called ACCUFET shown schematically in FIG. 1. An n+ substrate 2 has an n-type epilayer 4 forming the body deposited on top. Trench gates 6 extend vertically into the epilayer 4, the gates 6 being insulated from the epilayer 4 by a thin gate insulator 8. N+ source diffusions 10 are provided adjacent the gates, and front 12 and back 14 contacts connect the structure.

In use, electrons flow from the source diffusions 10 to the substrate 2 under the control of voltage applied to the trench gates 6.

Unlike a conventional vertical trench MOS structure, the ACCUFET of FIG. 1 does not have a p-type body. This is done to provide two way blocking and to reduce the total on-resistance by omitting the channel resistance. However, there are a number of disadvantages. Firstly, there are significant constraints on the integral of the doping concentration laterally between the trench gates 6. The doping concentration profile must be such that when the gate voltage is negative the depletion layers of each of the trenches reach the centre to pinch off the electron current between source and drain. This is discussed in more detail in T Syau et al, IEEE Transactions on Electron Devices, vol 41, number 5, May 1994, which suggests doping concentrations of for example $1 \times 10^{14}$ cm$^{-3}$ and a mesa width of 1 μm giving an integral of $1 \times 10^{10}$ cm$^{-2}$ for low leakage currents and practical values of the threshold voltage. Secondly, the threshold voltage is low. Thirdly, the substrate forms an important part of the on-resistance.

There is thus a need for an improved semiconductor structure for bidirectional switching.

According to a first aspect of the invention, there is provided a semiconductor device having opposed first and second major surfaces, comprising: a body region at the first major surface; at least one cell having longitudinally spaced source and drain implantations extending into the body region from the first major surface, the source and drain implantations being spaced away from the substrate by part of the body region and defining a channel part of the body region between the source and drain implantations; and at least one insulated gate trench extending longitudinally from the source implantation to the drain implantation through the body region, the insulated gate trench including a gate conductor insulated from the source and drain implantations and the body region by a gate dielectric along the side and end walls and the base of the trench, the source and drain implantations extending along part of the side walls of the trench, wherein the source and drain implantations include conductive shallow contact regions at the first major surface extending vertically into the body to a depth of no more than 35% the depth of the trench.

This structure has a number of advantages over the structure described above with reference to FIG. 1. Since both source and drain are on the first major surface, the substrate resistance is not an important part of the total resistance.

The structure is relatively easy to manufacture since the source and drain implantations are readily formed by implantation in a substrate, a conventional semiconductor process that can be carried out without difficulty.

A further reason that the structure is relatively straightforward to manufacture is that it is formed in a single semiconductor body, that is to say integrated on a single substrate. The semiconductor body may be, for example, an epilayer on a semiconductor substrate in a silicon on insulator. There is no need for a complex hybrid structure using the approach according to the invention.

It will be appreciated that various prior art semiconductor devices are available, with different properties. The invention aims to improve the current handling capability as compared with low doped lateral diffused MOS (LDMOS) technology, or in other words to achieve a trade-off between breakdown voltage and specific on-resistance that is better than would be achieved in a bidirectional device using such prior technology.

The thickness of the part of the body region between the source and drain implantation and the substrate should be of sufficient thickness so that the diode formed between the source region or drain region of one conductivity type and the substrate of the opposite conductivity type does not break down with design voltages applied to the source and drain.

The required sizes and thicknesses will depend on the breakdown voltage required. For a 20V-30V device, the channel length may preferably be in the range 0.5 to 2 μm, and the distance of the n$^+$ source and drain from the p body about 0.5 to 1.5 μm.

The source and drain regions include a conductive shallow contact region. To make the region conductive, a high doping will generally be required and providing this only to a shallow depth may ease manufacture. The "shallow" depth may be preferably no more than 35%, further preferably no more than 20% and most preferably no more than 10% of the depth of the trench. Alternatively expressed, the shallow doping may be no more than 0.5 μm, preferably no more than 0.3 μm. Typical values lie in the range 0.15 μm to 0.25 μm.

Preferably, the body is of opposite conductivity type to the contacts. The use of a body of opposite conductivity type to the source and drain contacts avoids the need for precise doping values in the body layer as would be the case for the ACCUFET of FIG. 1. The structure is normally off.

In alternative, less preferred, embodiments the body region is of the same conductivity type. This has the disadvantage that the same low doping concentration and width to result in a low total doping density would be required as in the vertical ACCUFET of FIG. 1—see T Syau et al (referenced above).

Each source and drain implantation may be a double doped implantation having a contact region at the first major surface and a lower doped region extending vertically into the body below the contact region, the lower doped region having the same second conductivity type as the contact region but a lower doping.

This double doping is particularly useful for higher voltage applications and/or obtaining higher currents and correspondingly reduced specific on-resistance.

The deeper the source or drain, and the deeper the trench, the more current may be obtained. The double doped structure allows higher current values without the need to implant the high doping densities preferred for contact regions deep into the substrate, which would cause manufacturing difficulty. Preferably, the lower doped region extends to at least 80% the depth of the trench.

Alternatively, in lower voltage applications the source and drain regions may include only the shallow contact regions.

In a preferred arrangement, the trench depth is 0.5 to 2 μm.

In preferred embodiments there are a plurality of such source implantations, a respective plurality of drain implantations longitudinally spaced from respective source implantations, and a respective plurality of insulated gate trenches extending between the respective source and drain implantations.

This increases the current handling capability of the device and reduces the on-resistance. The design of the device is such that it is easy to connect a plurality of devices in parallel without complexity and without taking up too much silicon area.

In a preferred arrangement, the source implantation includes a higher doped source region and a lower doped source drift region between the higher doped source region and the body; the drain implantation includes a higher doped drain region and a lower doped drain drift region between the higher doped drain region and the body; the insulated gate trench includes potential plate regions extending longitudinally on either side of a central region, the potential plate regions being adjacent to the source and drain drift regions respectively, and the central region being adjacent to the body; and the thickness of the gate dielectric sidewalls is greater in the potential plate regions of the insulated gate than the central region.

The inventors have thus realised how to apply the reduced surface electric field (RESURF) principle to a bidirectional device. The potential plate regions act to ensure the RESURF effect and the device in this arrangement is therefore known as a RESURF device. When the device is switched off, the drift regions adjacent to the potential plates are depleted and thus drop voltage relatively evenly along the drift region. The overall breakdown voltages between source and drain may thereby be improved as compared with a device in which the potential plates is omitted.

The device may be provided on a conductive substrate of first conductivity type. This substrate may be grounded to ground the body.

The body may be epitaxially grown or implanted on the top of the substrate.

A contact may be provided to contact the body. In embodiments in which the body is grown on a conductive substrate, this may be a rear contact.

In alternative embodiments an insulating substrate may be used, such as an insulating semiconductor substrate, sapphire, or other insulating substrate as will be known. In this case, a conductive buried layer is preferably provided under the body and over the substrate to contact the body.

For a better understanding of the invention, a prior art structure and embodiments of the invention will now be described with reference to the accompanying drawings, in which.

The drawings are schematic and not to scale. The same reference numerals are used in different figures for the same or like features.

Figure 1:
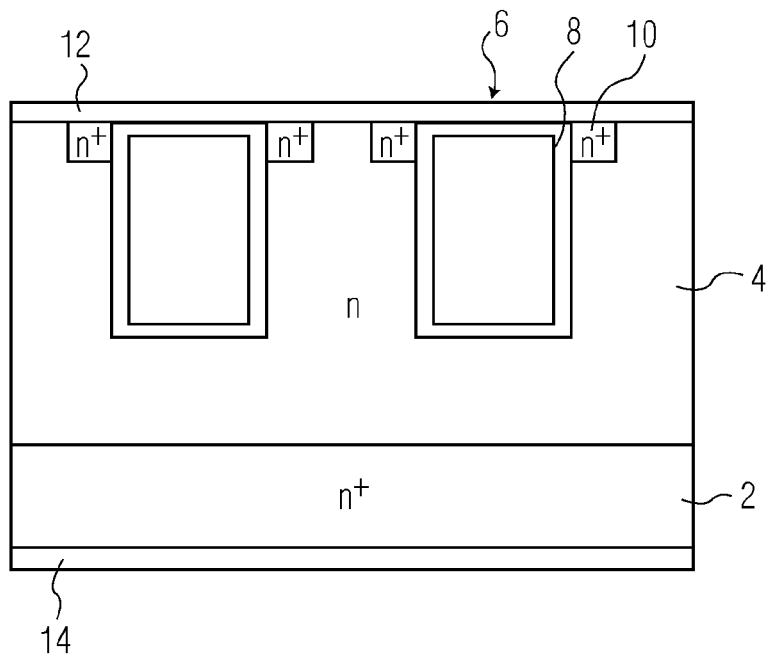
FIG. 1 shows a prior art ACCUFET structure.
Figure 2:
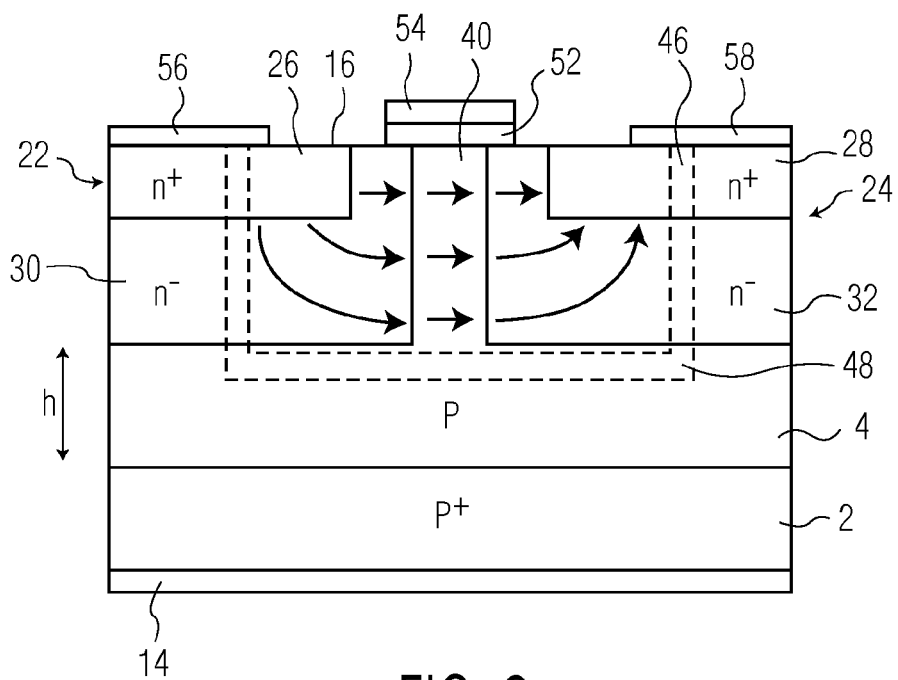
FIG. 2 shows a side cross-sectional view of a structure according to a first embodiment of the invention.
Figure 3:
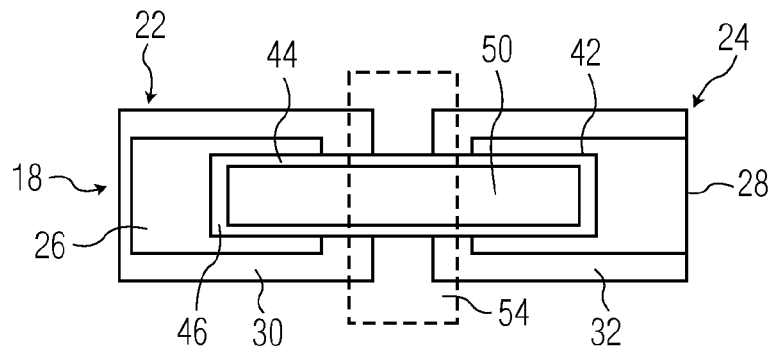
FIG. 3 shows a top view of the structure of FIG. 2.

FIGS. 2 and 3 illustrate a first embodiment of a semiconductor device according to the invention. A p+ substrate 2 has a p-type body 4 on it defining a first major surface 16. A single cell 18 has like source and drain implantations 22, 24 provided in the p-type body 4 at the first major surface 18 spaced apart from one another leaving a channel region 40 between them. Each of the source and drain implantations is a double doped structure, i.e. a double diffused structure, having a relatively shallow n+ contact region 26, 28 of depth 0.2 μm (in this example) at the first major surface 18 and an n− low doped region 30, 32 extending into the substrate away from the first major surface 18 from the n+ contact region. Note that the structure is a bidirectionally symmetric structure and so the terms source and drain are used simply to agree with conventional nomenclature and do not imply any difference between them.

An insulated trench 42 extends from the source 22 to the drain 24 implantation through the channel 40. The trench has sidewalls 44, end walls 46 and a base 48, all of gate dielectric, and is filled with a conductive polysilicon gate 50. The trench is arranged to extend from within the n+ source contact region 26 to the n+ drain contact region 28 such that the n+ contact regions 26, 28 and lower doped regions 30, 32 extend along both the sidewalls 44 of the trench.

In alternative arrangements the polysilicon may be replaced by metal or an intermetallic compound.

The thickness of the epilayer h is preferably fairly thick, i.e. thicker than the channel region, to avoid premature breakdown of contacts 1 and 2 at the n+−n− −p−−p+ diode of contact regions 26, 28, lower doped region 30, 32, layer 4 and substrate 2.

A conductive gate electrode 54 is provided extending laterally across the transistor, in contact with the gate 50 and insulated from the body 4 in the channel 40 by insulator 52 as shown in FIG. 2. The insulator may for example be of oxide. Source contact electrode 56 and drain contact electrode 58 connect to source and drain 22, 24 respectively. Back contact 14 is provided to connect to the body layer 4 through conductive substrate 2. In use, this contact may be grounded. The potential of the contact determines the threshold voltage. If the contact were connected to a positive voltage it would add to the total threshold voltage.

Figure 4:
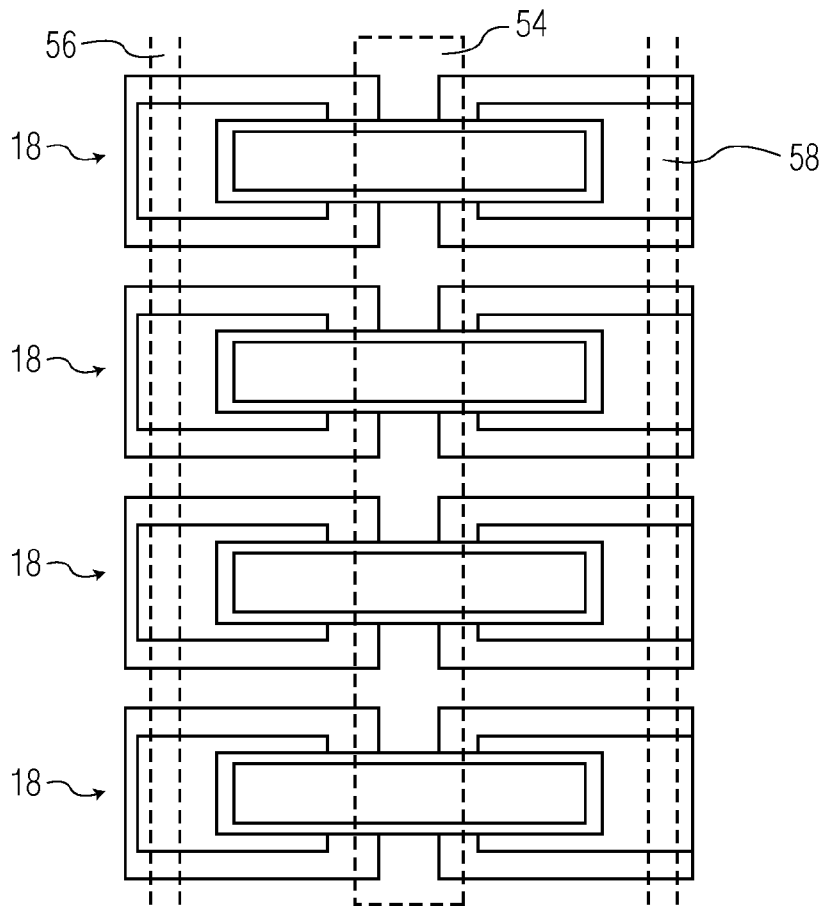
FIG. 4 shows an array of a plurality of the structures shown in FIGS. 2 and 3.

FIGS. 2 and 3 show a single cell 18 though in practice a plurality of cells 18 will be provided laterally spaced across a substrate to improve current handling and reduce the on resistance. This is shown in FIG. 4 which shows a configuration in which the cells 18 are arranged side by side with the laterally extending gate electrode 54 connecting to all the gates in parallel and laterally extending source 56 and drain 58 electrodes likewise extending laterally to connect the sources and drains respectively in parallel.

The design of the individual cell makes it easy to connect cells 18 in parallel in this way. The source gate and drain electrodes can simply extend laterally to connect to the laterally arranged cells in parallel.

The skilled person will be aware of many ways of manufacturing the semiconductor devices according to the invention, and no specific limitation is intended. For example, the p-body layer 4 may be epitaxially grown on substrate 2, or may be formed by implantation into the first major surface 18 of substrate 2. Indeed, the fact that the device only makes use of relatively standard processing is of particular benefit. The use of shallow n⁺ implants avoids any difficulty that might be incurred in implanting deep n⁺ implants that might otherwise be required to even out the electron flow and to avoid too much current passing at the top of the device and not enough in the trench.

In this embodiment of the invention, current flow through the complete depth of the body is enhanced using the lower doped source and drain regions. The lower doping means that it is easier to implant these to significant depths and obtain higher breakdown voltages.

In use, the source, gate and drain contacts are connected as required and the back contact 14 is preferably grounded. The structure is normally off, because of the p-type channel 40, and so does not conduct unless a voltage is applied to the gate electrode 54. A positive gate voltage allows electrons to flow as indicated by arrows 58 from source 22 to drain 24, assuming the source is more negative than the drain. The device is bidirectional, so it is equally possible to control electrons flowing in the opposite direction.

The advantage of this structure compared to an ACCUFET is that in view of the p-type body the doping of the source and drain regions is not defined. Further, the current does not flow through substrate 2 so the substrate resistance is not a factor.

Figure 5:
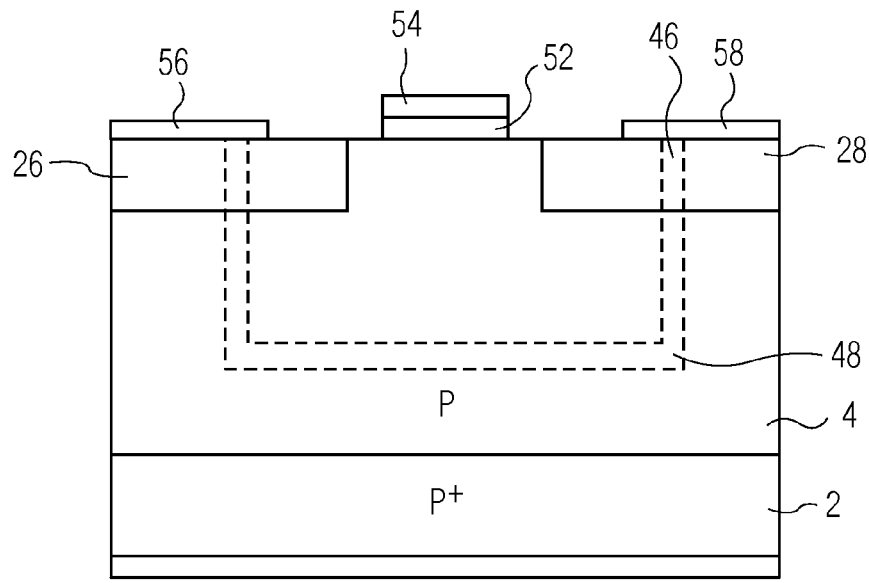
FIG. 5 shows a side cross-sectional view of a structure according to a second embodiment of the invention.

In an alternative embodiment, suitable for lower voltage applications, the lower doped regions 30, 32 are omitted as shown in FIG. 5. In this case, the p– body 4 and substrate 2 are short circuited and connected to ground.

Figure 6:
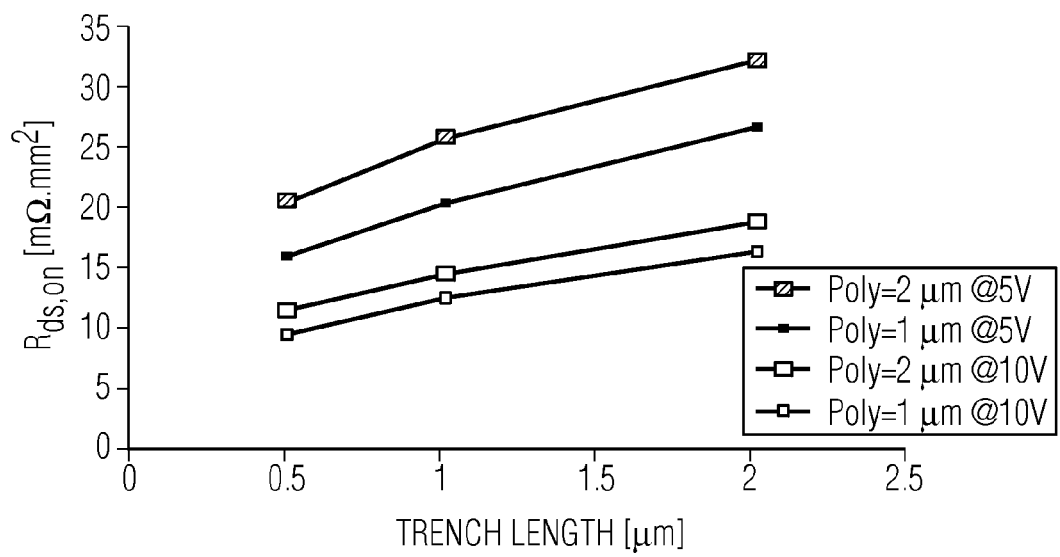
FIG. 6 shows measured on-resistance values for the device of FIG. 5.

FIG. 6 illlustrates some measured on-resistance values for the device illustrated in FIG. 5. A minimum on-resistance of 10 mΩ.mm² is achieved for a 10V gate voltage. Note that there is some dependence on trench length.

Figure 7:
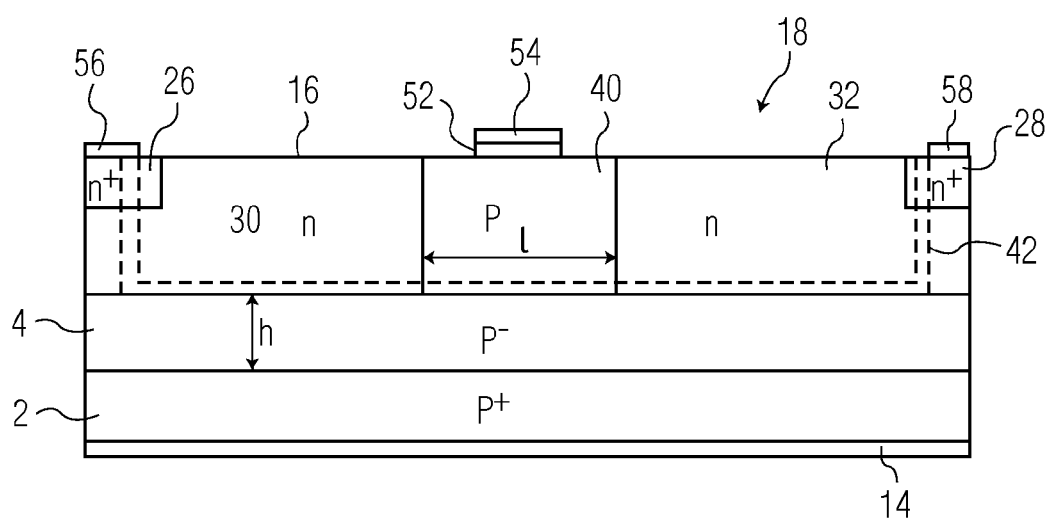
FIG. 7 shows a side cross-sectional view of a structure according to a third embodiment of the invention.
Figure 8:
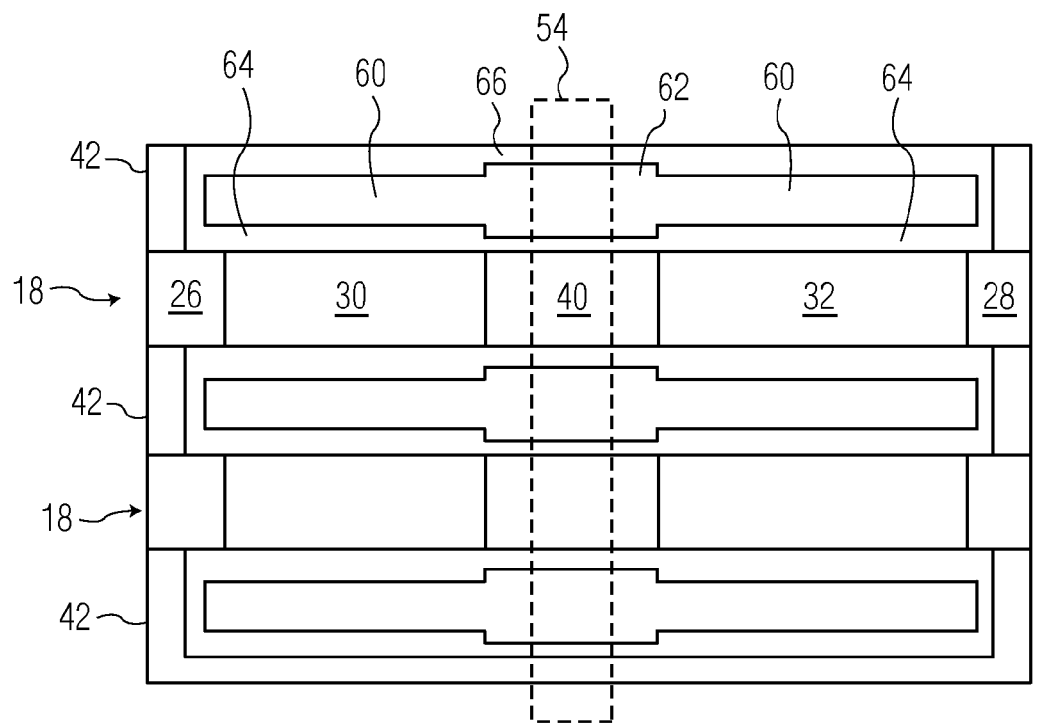
FIG. 8 shows a top view of the structure of FIG. 7.

FIGS. 7 and 8 show a third embodiment of the invention in side section and top views respectively.

In this arrangement, a p⁻ layer 4 is provided on a p⁺ substrate 2. A plurality of laterally spaced cells 18 each extend longitudinally across the first major surface 16 of the semiconductor device formed by the top of the p⁻ layer.

Each cell includes a central p-type body 40. At one end of the body 40 is a source implantation made up of an n⁺ doped source contact region 26 and an n doped source drift region 30 between the source contact region 26 and the body 40. On the other end of the body 40 is a drain implantation made up of an n⁺ doped drain contact region 28 and an n-type drain drift region 32 between the drain contact region 28 and the body 40. Thus, when the cell is on current flows from the source contact region 26 to the drain contact region 26 through the source drift region 30, the body 40 and the drain drift region 32. The device is bidirectional, so current can also flow in the opposite direction.

Gate trenches 42 alternate laterally with the cells 18. The gate trenches include a central region 62 and a potential plate region 60 extending longitudinally from each end of the central region 60. The thickness of the gate dielectric 44 of sidewalls 64 of the potential plate regions 60 is greater than the thickness of sidewalls 66 of the central region.

The central region 62 is adjacent to the body 40 and the potential plate regions 60 are adjacent to the source and drain drift regions 26,28, though the boundaries between the potential plate and central region need not align exactly with the boundaries between the source and drift regions.

Gate connector 54 extends laterally connecting to the gates 32, insulated from the body region 40 where the gate connector 54 passes over the body region 40 by insulator 52. Source and drain connectors 56, 58 likewise extend laterally to connect to the source contacts 26 and drain contacts 28 respectively. For clarity, these are shown only in FIG. 7 and are omitted from FIG. 8.

In this arrangement, the trenches are as deep as the body 40. Preferably, however, the trenches are less deep than the body 40 to avoid parasitic current flow under the trench at low threshold voltage.

In use, the drift regions 26,28 are depleted when the device is switched off and the length, l, of the drift region determines the breakdown voltage. The thickness, h, of the p-type layer 4 is chosen to be great enough to avoid breakdown in the vertical p-n diodes constituted by the source and drain implantations and the p⁺ substrate 2. Thus, breakdown voltage can be increased.

When a positive voltage is applied to the gate, the device is switched on and electrons pass through the cells either from source to drain or drain to source.

By using RESURF the doping in source and drain drift regions 30,32 may be higher than it would be without using RESURF for the same source-drain breakdown voltage. This higher doping results in a lower on-resistance.

As in other embodiments, a key benefit of this arrangement is that the device is bidirectional.

In an alternative RESURF arrangement the doping in the drift regions 26, 28 is graded, for example by providing a linear graded doping profile with doping increasing outwardly from body 40.

In a further alternative, the potential plates 60 are not connected to the gate 32, but a separate connection to the potential plate is provided. In this arrangement, a further dielectric layer is provided between the potential plates and the gate 32.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

For example, the invention may be implemented in p-MOS instead of n-MOS by inverting the conductivity types used. The doping in the drift region may be of the same conductivity type as the body instead of the opposite type. The invention could be used in silicon on insulator (SOI) devices instead of on a conductive semiconductor substrate; the substrate 2 may be replaced by a buried layer.

Further, the arrangement of cells on the first major surface may be varied as required.

The invention claim is:

1. A semiconductor device having opposed first and second major surfaces, comprising:
   a body region in a substrate at the first major surface;
   a plurality of cells each having longitudinally spaced source and drain implantations extending into the body region from the first major surface, each of the source and drain implantations being spaced away from the substrate by part of the body region and defining a channel part of the body region between the respective source and drain implantations, the source implantations of the cells not being formed by a common region and the drain implantations of the cells not being formed by a common region; and for each of the cells, an insulated gate trench extending longitudinally from the source implantation of the cell to the drain implantation of the cell through the body region, the insulated gate trench including a gate conductor insulated from the source and drain implantations of the cell and the body region by a gate dielectric along the side and end walls and the base of the gate trench, the source and drain implantations of the cell extending along part of the side walls of the gate trench, wherein the source and drain implantations of each cell include conductive shallow contact regions at the first major surface extending vertically into the body to a depth of no more than 35% of the depth of the trench.

2. A semiconductor device according to claim 1 wherein the body region is of first conductivity type and the shallow contact regions are of a second conductivity type opposite to the first conductivity type.

3. A semiconductor device according to claim 1 or 2 wherein each of the source and drain implantations further comprises a lower doped region of lower doping than the shallow contact region.

4. A semiconductor device according to claim 3, wherein for each of the cells:
the source implantation includes a higher doped shallow source contact region and a lower doped source drift region between the higher doped source contact region and the body;
the drain implantation includes a higher doped shallow drain contact region and a lower doped drain drift region between the higher doped drain contact region and the body;
the insulated gate trench includes potential plate regions extending longitudinally on either side of a central region, the potential plate regions being adjacent to the source and drain drift regions respectively, and the central region being adjacent to the body; and
the thickness of the gate dielectric sidewalls of the insulated gate trench is greater in the potential plate regions of the insulated gate than the central region.

5. A semiconductor device according to claim 1, further comprising:
a gate electrode that is electrically connected to each of the gate trenches;
a source electrode that is electrically connected to the conductive shallow regions of the source implantations of each of the cells; and
a drain electrode that is electrically connected to the conductive shallow regions of the drain implantations of each of the cells.

6. A semiconductor device according to claim 1 wherein gate trenches alternate with the plurality of cells laterally across the first major surface.

7. A semiconductor device according to claim 1 wherein each of the cells has one of the gate trenches laterally within the confines of the cell.

8. A semiconductor device according to claim 3 wherein the lower doped region of lower doping than the shallow contact region extends vertically below the shallow contact region to a depth at least 80% of the depth of the trench.

9. A semiconductor device according to claim 1, wherein the source and drain implantations consist exclusively of the shallow contact region.

10. A semiconductor device according to claim 1 on a conductive substrate of first conductivity type.

11. A semiconductor device having opposed first and second major surfaces, comprising:
a body region in a substrate at the first major surface;
at least one cell having longitudinally spaced source and drain implantations extending into the body region from the first major surface, the source and drain implantations being spaced away from the substrate by part of the body region and defining a channel part of the body region between the source and drain implantations; and
at least one insulated gate trench extending longitudinally from the source implantation to the drain implantation through the body region, the insulated gate trench including a gate conductor insulated from the source and drain implantations and the body region by a gate dielectric along the side and end walls and the base of the trench, the source and drain implantations extending along part of the side walls of the trench,
wherein the source and drain implantations include conductive shallow contact regions at the first major surface extending vertically into the body to a depth of no more than 35% of the depth of the trench, and
wherein the gate dielectric along the side and end walls of the trench is in contact with the gate conductor, the source and drain implantations and the respective shallow contact regions of the source and drain implantations.

12. A semiconductor device having opposed first and second major surfaces, comprising:
a body region in a substrate at the first major surface;
at least one cell having longitudinally spaced source and drain implantations extending into the body region from the first major surface, the source and drain implantations being spaced away from the substrate by part of the body region and defining a channel part of the body region between the source and drain implantations; and
at least one insulated gate trench extending longitudinally from the source implantation to the drain implantation through the body region, the insulated gate trench including a gate conductor insulated from the source and drain implantations and the body region by a gate dielectric along the side and end walls and the base of the trench, the source and drain implantations extending along part of the side walls of the trench,
wherein the source and drain implantations include conductive shallow contact regions at the first major surface extending vertically into the body to a depth of no more than 35% of the depth of the trench, and
wherein the insulated gate trench includes end portions extending into the source and drain implantations, with each of the source and drain implantations having portions thereof laterally adjacent to an endwall and opposing sidewalls of the trench to surround the end portion of the trench on three sides.

13. A semiconductor device comprising:
a body having an upper surface;
a source region in the body below the upper surface;
a drain region in the body below the upper surface;
a gate trench region extending laterally in the body below the upper surface, and having opposing ends respectively into the source region and the drain region, the gate trench region including
a gate dielectric material on sidewalls, endwalls and a bottom of the trench, the dielectric material at each end of the gate trench region being in contact with each of the respective source and drain regions on respective opposing endwalls and sidewalls of the trench,
a gate electrode in the trench and in contact with the gate dielectric material, and being separated from the respective source and drain regions by the dielectric material.

14. The device of claim 13, wherein
the source region and the drain region respectively include a contact region adjacent to the upper surface, and the gate trench region extends laterally into the contact region.

15. The device of claim 1, wherein the source and drain implantations of each of the cells are in contact with the gate dielectric along the end walls of one of the gate trenches.

16. The device of claim 1, wherein each of the gate trenches extends into the source and drain implantations of one of the cells.

* * * * *